(12) United States Patent
Okazaki et al.

(10) Patent No.: US 6,495,862 B1
(45) Date of Patent: Dec. 17, 2002

(54) NITRIDE SEMICONDUCTOR LED WITH EMBOSSED LEAD-OUT SURFACE

(75) Inventors: Haruhiko Okazaki, Yokohama (JP); Koichi Nitta, Yokohama (JP); Chiharu Nozaki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/469,340

(22) Filed: Dec. 20, 1999

(30) Foreign Application Priority Data

Dec. 24, 1998 (JP) .......................................... 10-366803

(51) Int. Cl.⁷ .............................................. H01L 33/00
(52) U.S. Cl. ........................ 257/103; 257/95; 257/98; 257/99
(58) Field of Search ............................ 257/94–103, 79, 257/13–19, 76–82; 313/499–510

(56) References Cited

U.S. PATENT DOCUMENTS 5,633,527 A * 5/1997 Lear .......................... 257/432
5,905,275 A * 5/1999 Nunoue et al. ................ 257/95
5,925,898 A * 7/1999 Spath .......................... 257/98
5,977,566 A   11/1999 Okazaki et al.
5,981,975 A * 11/1999 Imhoff .......................... 257/81
5,990,500 A   11/1999 Okazaki
6,194,743 B1 * 2/2001 Kondoh et al. ................ 257/94

FOREIGN PATENT DOCUMENTS

JP          04340534 A   * 11/1992
JP          10-56206       2/1998

* cited by examiner

*Primary Examiner*—Minh Loan Tran
*Assistant Examiner*—Thomas L Dickey
(74) *Attorney, Agent, or Firm*—Hogan & Hartson, LLP

(57) ABSTRACT

Efficiency of leading out light released from an active layer, i.e. the external quantum efficiency, can be improved remarkably by processing a light lead-out surface to have an embossment. A layer containing a p-type dopant like magnesium (Mg) is deposited near the surface of a p-type GaN layer to diffuse it there, and a p-side electrode is made on the p-type GaN layer after removing the deposited layer. This results in ensuring ohmic contact with the p-side electrode, preventing exfoliation of the electrode and improving the reliability.

13 Claims, 9 Drawing Sheets

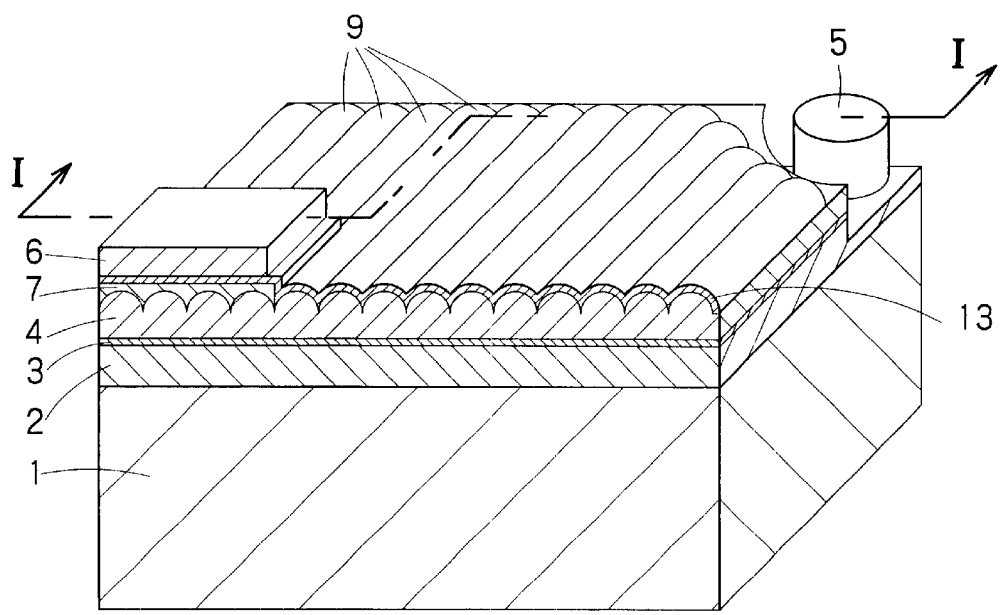
F I G. 1

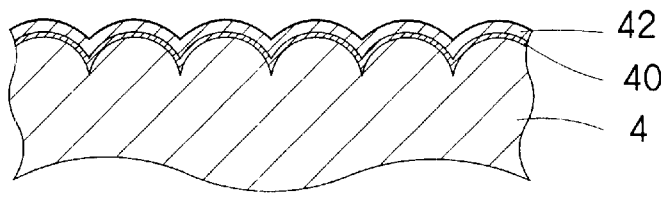
F I G. 3A
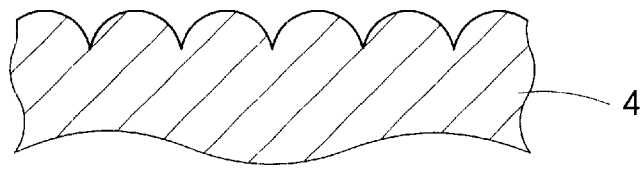
F I G. 3B
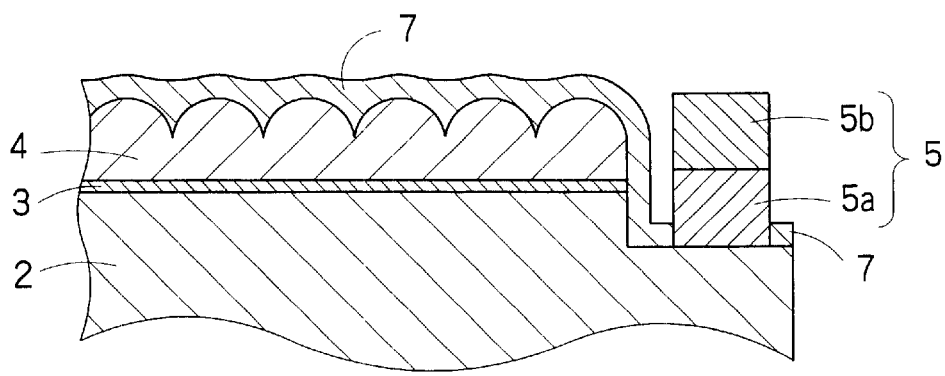
F I G. 3C
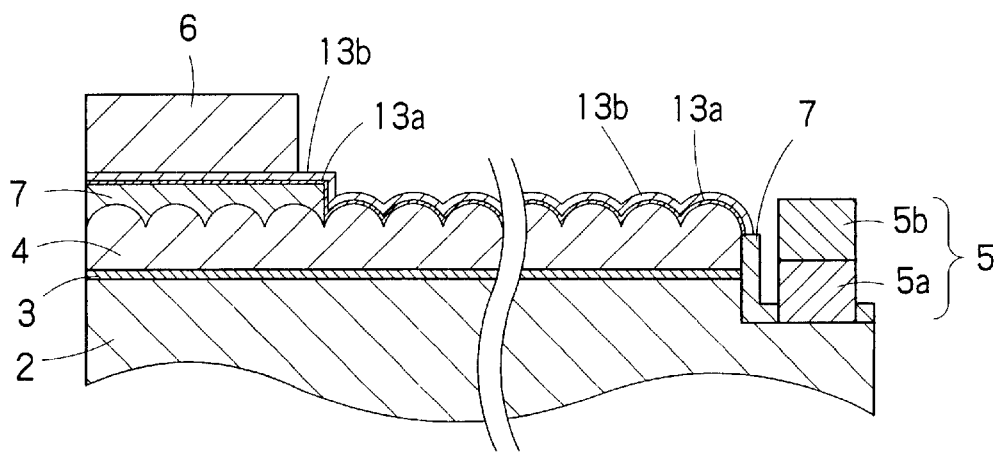
F I G. 3D

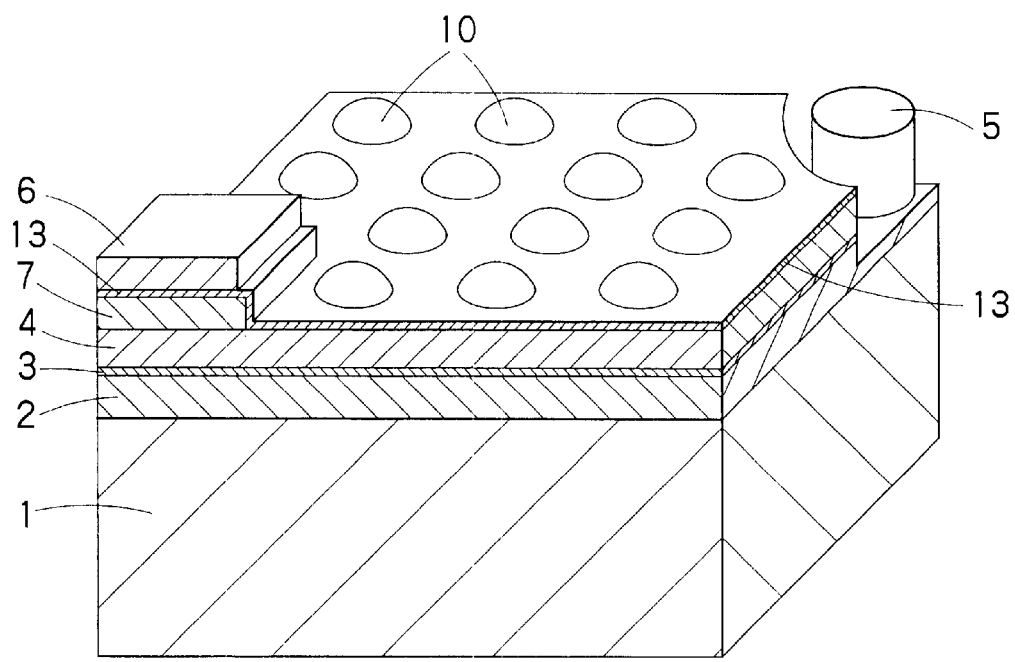
F I G. 5
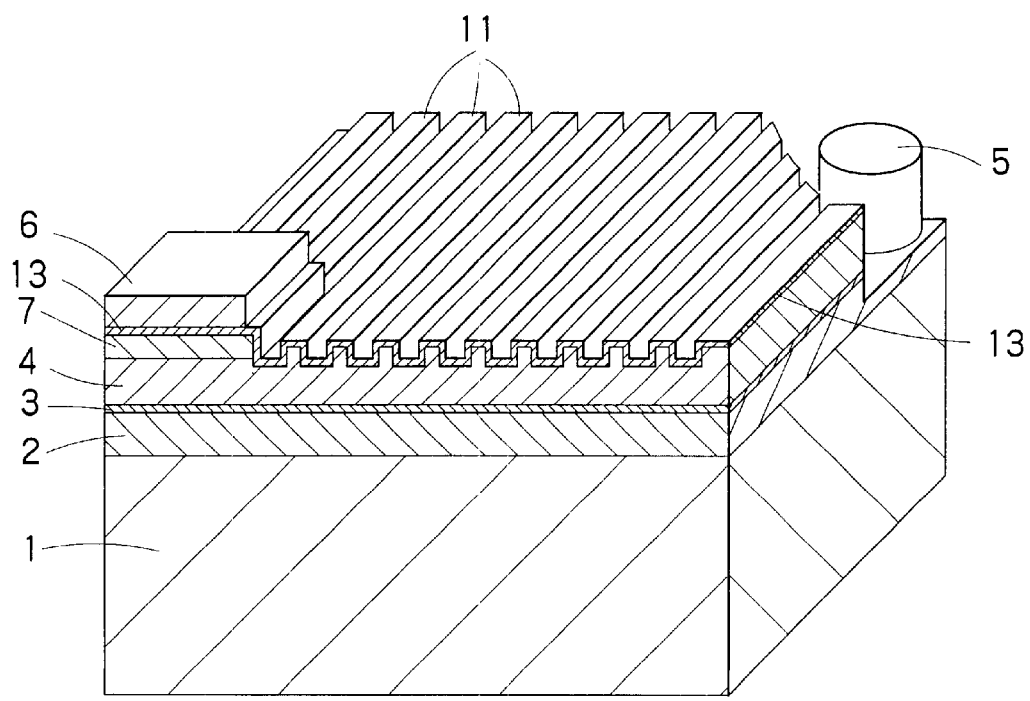
F I G. 6

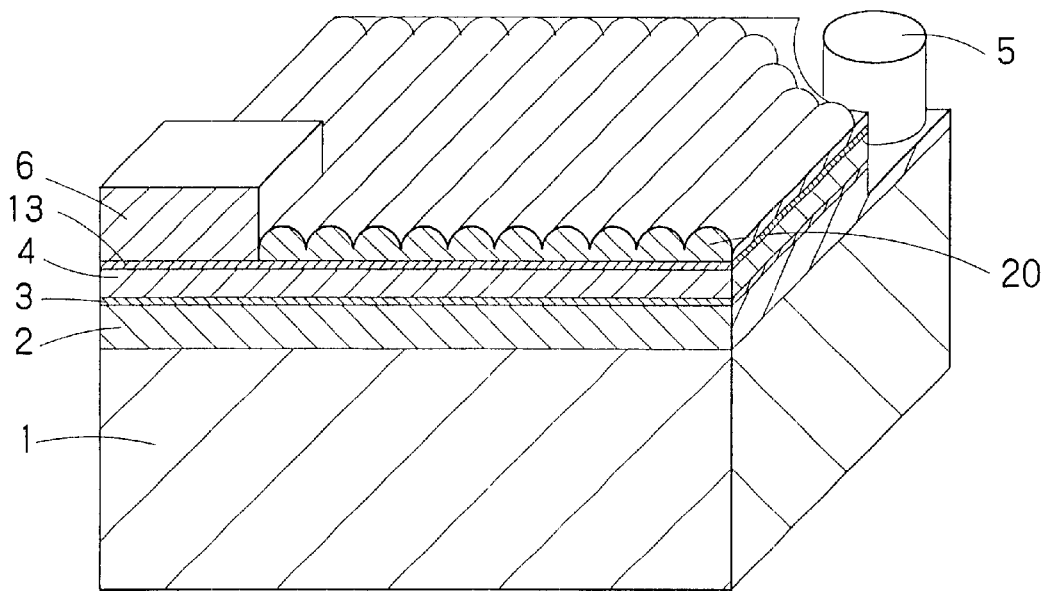
F I G. 9
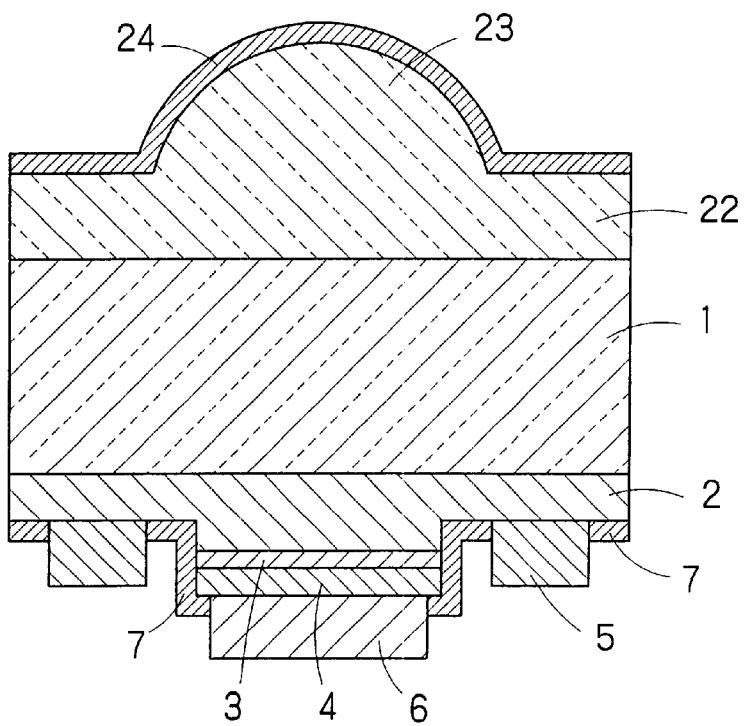
F I G. 10

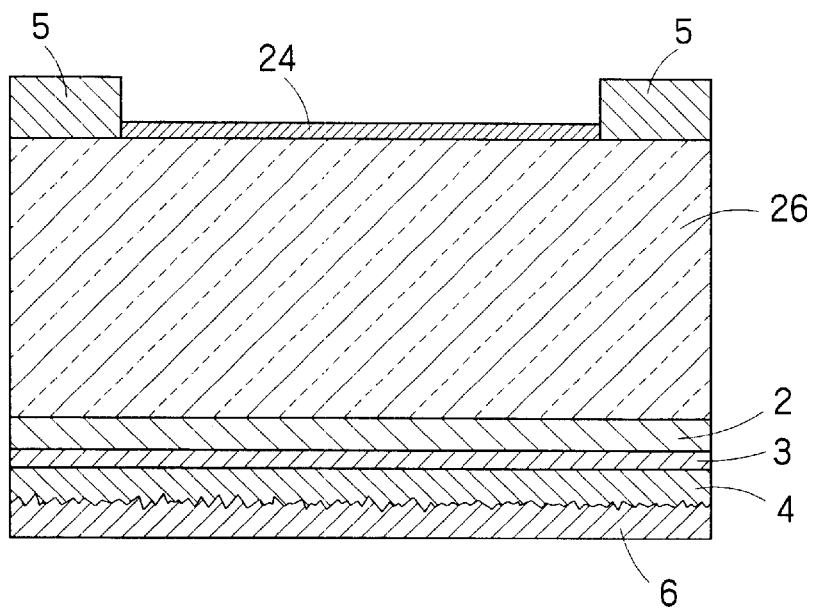
F I G. 13

NITRIDE SEMICONDUCTOR LED WITH EMBOSSED LEAD-OUT SURFACE

BACKGROUND OF THE INVENTION

This invention relates to a semiconductor light emitting device and its manufacturing method. More particularly, the invention relates to a light emitting device having a stacked nitride compound semiconductor layer of GaN, InGaN, GaAlN, or the like, which remarkably reduces the operation voltage of the device, increases the luminance, and improves the reliability, and a manufacturing method for manufacturing such a device.

Light emitting devices for wavelength bands from ultraviolet to green or blue are being brought into practice by using nitride compound semiconductors represented by gallium nitride.

In this application, "nitride compound semiconductors" involve III–V compound semiconductors expressed as $B_xIn_yAl_zGa_{(1-x-y-z)}N$ ($0 \leq x \leq 1$, $0 \leq y \leq 1$, $0 \leq z \leq 1$), and further involve mixed crystals containing phosphorus (P), arsenic (As), etc., in addition to nitrogen (N) as group V elements.

It is getting possible to realize emission of light with a high intensity which has been difficult heretofore, such as ultraviolet light, blue light and green light, for example, by making light emitting devices like light emitting diodes (LED) and semiconductor lasers using nitride compound semiconductor. Moreover, because of their crystal growth temperatures being high, nitride compound semiconductors are stable materials even under high temperatures, and their use to electronic devices is hopefully expected.

A review is made on LED as an example of semiconductor light emitting devices using nitride compound semiconductors.

FIG. 14 is a conceptional diagram showing a cross-sectional structure of a conventional nitride compound semiconductor LED. The conventional LED is made of a GaN buffer (not shown), n-type GaN layer 102, InGaN light emitting layer 103 and p-type GaN layer 104 which are epitaxially grown on a sapphire substrate 101 sequentially. The InGaN light emitting layer 103 and the p-type GaN layer 104 are partly removed by etching to expose the n-type GaN layer 102. Formed on the p-type GaN layer 104 is a p-side transparent electrode 113. Further stacked on a part of the p-side electrode 113 are an insulating film 107 for blocking current and a p-side bonding electrode 106. Formed on the n-type GaN layer 102 is an n-side electrode 105.

In this structure, a current injected through the p-side electrode 106 is spread out by the transparent electrode 113 having a good conductivity and injected from the p-type GaN layer 104 into the InGaN layer 103 to emit light there. The emitted light is led out outside the chip through the transparent electrode 113.

However, conventional nitride compound semiconductor light emitting devices as shown in FIG. 14 involved problems, namely, high contact resistance at electrode portions and insufficient external quantum efficiency of light.

That is, since GaN has a band gap as wide as 3.4 eV, it is difficult to ensure its ohmic contact with electrodes. This invites the problems that the contact resistance increases in electrode portions, operation voltage of the device increases, and a large amount of heat is generated.

Moreover, refractive index of GaN is as large as 2.67, and its critical angle of refraction is as very small as 21.9 degrees. That is, when viewed from the normal of the surface from which the light exits, light which enters with a larger angle than the critical angle of refraction cannot be led outside the LED chip. Even when an AR (anti-reflection) film is coated on the surface of the chip, this critical angle does not change. Therefore, it has been difficult to obtain a larger emission power by improving the external quantum efficiency.

SUMMARY OF THE INVENTION

It is therefore an object of the invention to provide a semiconductor light emitting element and its manufacturing method which ensure good ohmic contact with electrodes and improve the external quantum efficiency of light.

To attain the object, the semiconductor light emitting device according to the invention, including a light emitting portion made of a nitride compound semiconductor, is characterized in that embossment is formed on a light emitting surface to improve the efficiency of externally leading out the light released from the light emitting portion, and it can significantly improve the external quantum efficiency.

Alternatively, the semiconductor light emitting device according to the invention comprises a light emitting portion made of a nitride compound semiconductor, and a reflector reflecting a light emitted from said light emitting portion at a reflecting interface to release said light outside, wherein an embossment is formed on said reflecting interface. The reflector may also serve as an electrode.

Alternatively, the semiconductor light emitting device according to the invention comprises a substrate, a mesa provided on one side of said substrate and including a light emitting portion, a reflector provided on said mesa and reflecting a light emitted from said light emitting portion to release said light outside through said substrate, a light-transmissive portion provided on a side surface of said mesa, a reflective layer coated on a surface of said light-transmissive portion, and an embossment provided on another side of said substrate to improve the external quantum efficiency of lights emitted from said light emitting portion, said reflective layer reflecting a light leaking sideward from said light emitting portion of said mesa so as to release the light outside through said substrate.

The invention is used in the above-summarized mode, and demonstrates the following effects.

First, according to the invention, because of the embossment formed on the light emitting surface of the semiconductor light emitting device or on the reflecting interface, the external quantum efficiency of the light released from an active layer can be improved significantly.

Additionally, according to the invention, by making a high concentration of a p-type dopant such as magnesium (Mg) near the surface of a p-type GaN layer, it is possible to ensure ohmic contact with a p-side electrode, reduce the operation voltage of the device, alleviate heat generation and improve the reliability.

Further, according to the invention, by removing a doping metal layer from the surface of the p-type GaN layer after introducing a p-type dopant like magnesium, exfoliation of the p-side electrode can be prevented. That is, deterioration of the characteristics caused by exfoliation of the electrode can be overcome, and the reliability of the light emitting device can be improved. Simultaneously, by removing the doping metal layer, transparency of the light emitting surface can be maintained, and the emission intensity can be improved.

Furthermore, according to the invention, by providing a doping metal layer of magnesium, for example, and doping a high-density p-type dopant by diffusion, "surface roughness" of the p-type GaN layer can be prevented. That is, in order to make embossment on the surface of the p-type GaN layer, the GaN layer must be thick to a certain extent. When the GaN layer is grown thick by doping a p-type dopant by a high concentration, the problem of "surface roughness" occurs. According to the invention, however, since magnesium is introduced after growth, the doping concentration need not be so high during growth of the p-type GaN layer. Therefore, the GaN layer can be grown thick without inviting the problem of "surface roughness".

As summarized above, the invention provides a semiconductor light emitting device having a high external quantum efficiency, operative with a low voltage, and improved in reliability. Thus, the invention has great industrial advantages.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 1 is a conceptional perspective view illustrating a semiconductor light emitting device according to the invention;

FIGS. 3A through 3D are rough cross-sectional views of a light emitting device according to the invention in different steps of a manufacturing method of a major part thereof;

FIG. 5 is a conceptional perspective view illustrating a first modification of the invention;

FIG. 6 is a conceptional perspective view illustrating a second modification of the invention;

FIG. 9 is a conceptional perspective view illustrating a fifth modification of the invention;

FIG. 10 is a conceptional cross-sectional view illustrating a sixth modification of the invention;

FIG. 13 is a conceptional cross-sectional view illustrating a ninth modification of the invention.

DETAILED DESCRIPTION OF THE PREFERRED EMBODIMENTS

Figure 2A:
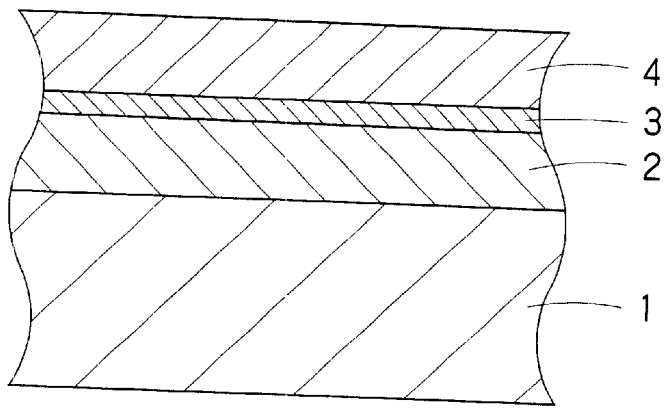
FIGS. 2A through 2D are rough cross-sectional views of a light emitting device according to the invention in different steps of a manufacturing method of a major part thereof.

Some embodiments of the invention are explained below with reference to the drawings.

FIG. 1 is a perspective conceptional diagram illustrating a semiconductor light emitting device according to the invention. The semiconductor light emitting device shown here has a structure sequentially stacking a GaN buffer layer (not shown), n-type GaN layer 2, InGaN light emitting layer 3, and p-type GaN layer 4 on a sapphire substrate 1. The InGaN light emitting layer 3 and the p-type GaN layer 4 are selectively removed by etching to expose the n-type GaN layer 2. Locally formed on the p-type GaN layer 4 is an insulating film 7 for blocking current. Formed on the p-type GaN layer 4 and the insulating film 7 is a p-side transparent electrode 13, and selectively stacked thereon is a p-side bonding pad 6. Further formed on the n-type GaN layer 2 is an n-side electrode 5.

One of features of the invention lies in embossment formed on the surface of the p-type GaN layer 4. That is, in the illustrated example, a plurality of cylindrical lens-shaped convex portions 9 are formed on the surface of the p-type GaN layer 4. By processing the surface of the p-type GaN layer 4, the external quantum efficiency of light released from the active layer 3 can be improved.

Figure 14:
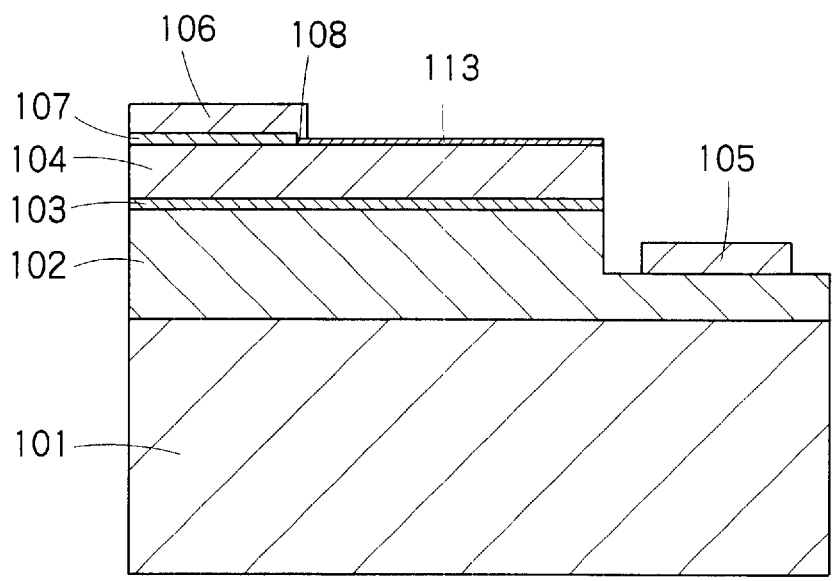
FIG. 14 is a conceptional diagram showing a cross-sectional structure of a conventional nitride compound semiconductor LED.

More specifically, in the case where the light emitting surface is smooth as shown in FIG. 14 illustrating conventional one, part of light released from the active layer, entering aslant with a normal angle larger than the critical angle relative to the emitting surface, is totally reflected. In contract, in the light emitting device according to the invention, even the light entering aslant of the light emitting surface can pass through to outside, depending upon incident angles relative to the corrugated surfaces. Additionally, also the totally reflected light repeats reflection at the corrugated surfaces, and in the course, when entering into corrugated surfaces with normal angles smaller than the critical angle, it can pass through to outside.

That is, as compared with the smooth light emitting surface in the conventional device, in case of the corrugated surface, the probability that the light enters from normal angles smaller than 21.9 degrees as the critical angle. As a result, the efficiency of externally leading out the light released from the active layer 3, i.e., the external quantum efficiency, can be improved significantly.

Additionally, in this embodiment, the convex portions on the surface of the p-type GaN layer 4 function as a plurality of cylindrical lenses or rod lenses as well. Therefore, part of light released from under linearly extending bottoms between convex portions of the active layer is converged by individual cylindrical lenses, and released as a plurality of linear beams.

Another feature of the semiconductor light emitting device according to the invention lies in making a high concentrated portion of magnesium (Mg) near the surface of the p-type GaN layer 4. That is, as explained later in greater detail, in the manufacturing process of the device according to the invention, a metal layer containing magnesium is once deposited on the surface of the p-type GaN layer 4, and after annealing it to spread magnesium along the surface portion of the GaN layer 4, the metal layer is removed to form the p-side transparent electrode 13. This unique process enables to increase the carrier concentration near the surface of the p-type GaN layer 4 and ensure ohmic contact with the transparent electrode 13. As a result, the operation voltage of the device can be reduced, and characteristics of the device can be improved.

Further, by doping magnesium to the surface portion of the p-type GaN layer 4 with a high concentration, "surface roughness" of the p-type GaN layer 4 can be prevented. That is, although the GaN layer 4 must be thick enough to make the embossment on the surface of the p-type GaN layer 4, the thick GaN layer 4 grown by doping a p-type dopant with a high concentration to ensure ohmic contact with the p-side electrode invited the problem of "surface roughness". Once such "surface roughness", the surface cannot restore the crystalline quality and the characteristics remain deteriorated even after the surface is processed to make embossment as the invention does.

However, according to the invention, since magnesium is introduced after growth, the doping concentration need not be so high during growth of the p-type GaN layer 4. Therefore, the GaN layer 4 can be grown thick without inviting the problem of "surface roughness".

Next explained is a specific example of the manufacturing method of the light emitting device according to the invention.

FIGS. 2A to 2D and FIGS. 3A to 3D are cross-sectional views of a major part of the light emitting device according to the invention under different steps of the manufacturing method of the light emitting device according to the invention. That is, they roughly show a part of cross-sectional views of a part taken along the I—I line in FIG. 1.

First, as shown in FIG. 2A, the GaN buffer layer, not shown, n-type GaN layer 2, InGaN light emitting layer 3, and p-type GaN layer 4 are sequentially grown on the sapphire substrate 1 by crystal growth. Usable for the crystal growth is, for example, MOCVD (metal-organic chemical vapor deposition), hydride CVD, MBE (molecular beam epitaxy), or the like.

Figure 2B:
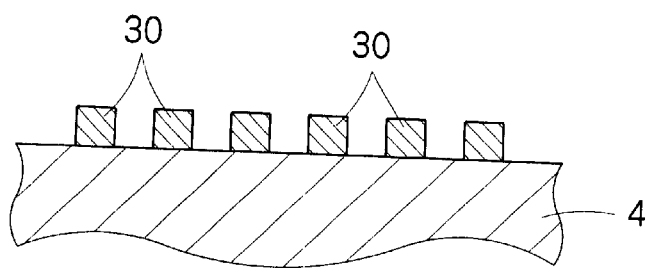

Next, as shown in FIG. 2B, a resist pattern is made. More specifically, a resist is coated on the surface of the p-type GaN layer, and it is patterned by photolithography technique to form a resist pattern 30 in form of a plurality of parallel stripes. Size of the resist pattern is preferably determined appropriately taking account of the distance from the active layer 3 to the light emitting surface, profile of optical intensity required in the optics using the light emitting element, and so on. For example, width of each stripe and intervals of stripes of the resist pattern may be about several microns, respectively.

Figure 2C:
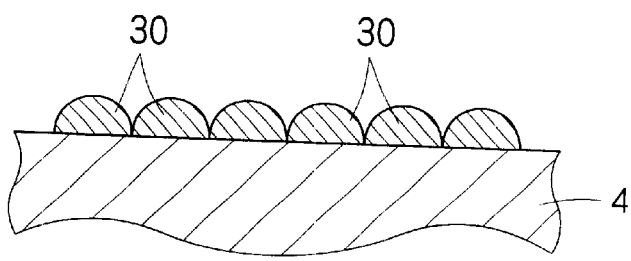

Next, as shown in FIG. 2C, the resist pattern 30 is processed into a configuration. More specifically, by annealing, the stripe-shaped resist is softened and deformed into semi-circular cylinders each having a semi-circular cross section.

Figure 2D:

Next, as shown in FIG. 2D, the shape of the resist pattern 30 is transferred to the p-type GaN layer 4. More specifically, etching is conducted by RIE (reactive ion etching) or ion milling, for example, from above the resist pattern 30. As a result, the resist pattern 30 is etched sequentially, and the p-type GaN layer 4 thereunder is also etched sequentially. In this manner, embossment similar to the cross-sectional configuration of the resist pattern 30 is formed on the surface of the p-type GaN layer 4.

Relation between the cross-sectional configuration of the resist pattern 30 and the cross-sectional configuration of the embossment on the surface of the p-type GaN layer 4 after the process is determined by the ratio of their etching speeds. That is, when the etching speed of the p-type GaN layer 4 is faster than the etching speed of the resist pattern 30, embossment of the p-type GaN layer 4 become deeper than the resist pattern. When the etching speed of the p-type GaN layer 4 is slower than the etching speed of the resist pattern 30, embossment of the p-type GaN layer 4 is shallower than the resist pattern 30. Therefore, embossment of the p-type GaN layer 4 can be controlled by appropriately adjusting the cross-sectional configuration of the resist pattern 30 and the etching selectivity.

Next as shown in FIG. 3A, a Mg (magnesium) layer 40 and a Au (gold) layer 42 are sequentially deposited by vapor deposition on the p-type GaN layer 4 having the embossment, and they are annealed. The layers 40 and 42 serve as the "doping metal layer." Thickness of the Mg layer 40 may be 10 nm, for example, and thickness of the Au layer 42 may be 100 nm, for example. By setting the annealing temperature not lower than 300° C., it results good. For example, flash annealing of 20 seconds or so under 750° C. is effective. By this process, Mg can be spread along the surface portion of the GaN layer 4, and a sufficiently high carrier concentration can be made on the surface. The Au (gold) layer 42 functions as a so-called "cap layer". That is, by providing the Au layer 42 on the Mg layer 40, it is possible to protect the Mg layer 40, prevent vaporization of Mg during annealing, and promote diffusion of Mg into the GaN layer 4. This annealing also contributes to alleviating a damage in the semiconductor layer during a dry process such as RIE or ion milling, and thereby recovering the crystallographic property.

As the "doping metal layer", a Mg layer and In (indium) layer may also be stacked instead of depositing the stacked structure of the Mg layer and the Au layer. Alternatively, a Mg layer, In layer and Au layer may be stacked. It is also acceptable to stack an alloy layer containing Mg in at least one of Au and In. When using In, In also diffuses together with Mg near the surface of the GaN layer 4 and locally makes an InGaN-like thin layer. Since InGaN has a smaller band gap than GaN, ohmic contact with the p-side electrode is further improved.

Not limited to Mg, other various group II elements appear to be usable as the p-type dopant. Good results may be obtained even by using Be (beryllium), Hg (mercury), Zn (zinc) or Cd (cadmium), for example. Furthermore, various other materials such as C (carbon) are usable as the p-type dopant.

Next, as shown in FIG. 3B, the doping metal layer containing the layers 40 and 42 is removed by etching. In this status, the surface portion of the p-type GaN layer 4 contains a high concentration of doped Mg. By removing the Mg layer 40 and the Au layer 42, "exfoliation" of electrodes formed later can be prevented. The Inventors confirmed through experiments that the p-side electrode is liable to unstick when the Mg layer is interposed between the p-type GaN layer 4 and the p-side electrode. According to the invention, however, since the Mg layer 40 is removed, exfoliation of the p-side electrode is prevented. Removal of these metal layers is simultaneously advantageous for transparency of the light emitting surface and for improvement of the light emission intensity.

Next as shown in FIG. 3C, the n-side electrode 5 is made. In a specific example, the p-type GaN layer 4 and the active layer 3 are partly removed by etching to expose the n-type GaN layer 2. Then, a $SiO_2$ film 7 is deposited by thermal CVD, and patterned by PEP. Thereafter, a Ti layer 5a and an Au layer 5b are formed by vapor deposition on the exposed portion of the n-type GaN layer 2. There follows patterning by lift-off, flash annealing for about 20 seconds at 800° C., and the n-type electrode 5 is obtained.

Next, as shown in FIG. 3D, the p-side electrode 13 is made. In a specific example, the $SiO_2$ film 7 is removed from the surface of the p-type GaN layer 4 by patterning using PEP. Then, on the p-type GaN layer 4 having formed the embossment, a 5 nm thick Ni (nickel) layer 13a is formed as the contact metal layer by vapor deposition, and an ITO (indium tin oxide) transparent electrode 13b is made by sputtering. Pt (platinum) is also usable in lieu of the Ni (nickel) layer 13a. The use of the contact metal layer 13a of Ni or Pt under the ITO layer 13b improves the adhesion strength of the ITO layer and decreases the contact resistance.

By thereafter stacking the gold (Au) or gold-germanium (AuGe) layer and patterning it by PEP, the bonding pad 6 in connection with the ITO transparent electrode 13 is obtained.

Part of the $SiO_2$ film 7 remaining on the p-type GaN layer 4 functions to prevent emission of light under the bonding pad 6 and thereby improve the emission efficiency. The $SiO_2$ film 7 made after locally exposing the n-type GaN layer 2 also lies on the exposed mesa side surface of the light emitting layer 3, around the n-side electrode and around the p-side electrode excluding the overlapping portion of the transparent electrode and the p-side electrode, as shown in FIGS. 3C and 3D.

Figure 4A:
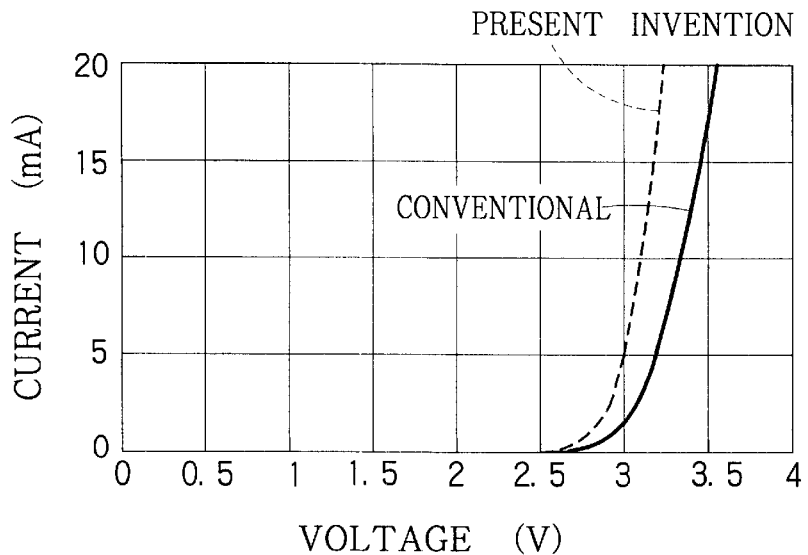
FIG. 4A is a graph showing current-voltage characteristics of a semiconductor light emitting device according to the invention.
Figure 4B:
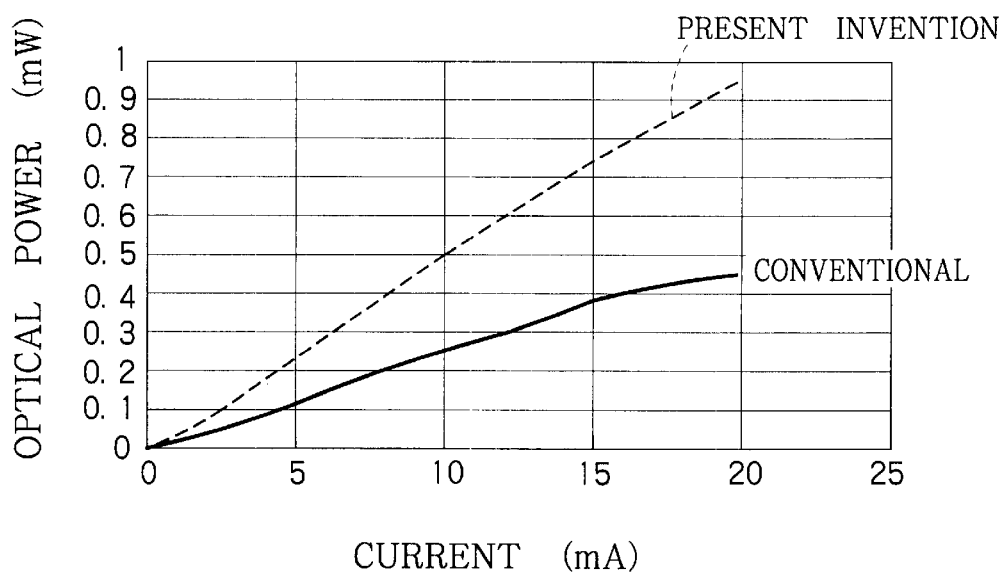
FIG. 4B is a graph showing current-light power characteristics of the semiconductor light emitting device according to the invention.

FIGS. 4A and 4B are graphs showing characteristics of the semiconductor light emitting device obtained through these processes. FIG. 4A shows current-voltage characteristics, and FIG. 4B shows current-optical power characteristics. In these graphs, characteristics of the conventional semiconductor light emitting device shown in FIG. 14 are shown as well.

Referring to the current-voltage characteristics shown in FIG. 4A, operation current of the conventional device under 3 volts is around 1 mA, and the rise of the current upon a voltage increase is slow. In case of the device according to the invention, however, 5 mA is obtained under 3 Volts, and the current rapidly rises with a voltage increase. In the device according to the invention, voltage is as low as approximately 3.2 Volts when the current value is 20 mA. That is, the invention could reduce the operation voltage by at least 10% as compared with the conventional device.

Referring to the emission characteristics shown in FIG. 4B, it is apparent that the device according to the invention can double the optical output as compared with the conventional device. Remarking optical outputs under the operation current of 20 mA, for example, 0.95 mW is obtained in the device according to the invention whereas it is 0.45 mW in the conventional device. Thus, according to the invention, the external quantum efficiency was improved by making embossment on the light emitting surface, and optical output as large as twice or more of conventional one could be obtained.

Additionally, emission wavelength of the light emitting device according to the invention was approximately 450 nm. Furthermore, in the device according to the invention, surface morphology of the p-type GaN layer 4 was good, and no "surface roughness" occurred even though it was grown relatively thick. Moreover, bonding strength of the transparent electrode layer 13 formed on the surface of the p-type GaN layer 4 was good, and exfoliation did not occur.

As explained above, it has been confirmed that the invention certainly provides a semiconductor light emitting device having excellent p-side ohmic contact, high external quantum efficiency and high reliability.

Next explained are some modified examples of the invention.

FIG. 5 is a conceptional perspective view showing a first modified example of the invention. In FIG. 5, portions equivalent to those explained with reference to FIGS. 1 through FIG. 3D are labeled common reference numerals, detailed explanation thereof is omitted. In this modified example, convex portions 10, which are hemispherical and not semicircular-cylindrical, are formed on the surface of the p-type GaN layer 4. This is also effective for improving the light lead-out efficiency, i.e., the external quantum efficiency.

The embossment used in this modified example can be made in substantially the same manner as the process explained with reference to FIGS. 2A through 2D. That is, by coating a resist having circular patterns on the p-type GaN layer 4, then heating and softening to form lens-shaped convex portions and thereafter etching it, the semi-spherical convex portions 10 can be made as shown in FIG. 5.

Similarly to the device explained with reference to FIG. 1, the modified example shown here also greatly improves the probability of externally leading out light released from the active layer 3, that is, the external quantum efficiency.

Additionally, with this modified example, light released from under the convex portions of hemispherical lenses can be converged and released externally.

Next explained is a second modified example of the invention.

FIG. 6 is a conceptional perspective view showing the second modified example of the invention. Here again, portions equivalent to those explained with reference to FIGS. 1 through 3D are labeled common reference numerals, and detailed explanation thereof is omitted. In this modified example, a plurality of mesa stripe-shaped convex portions 11, instead of spherical ones, are formed on the surface of the p-type GaN layer 4. This is also effective for improving the light lead-out efficiency, i.e., the external quantum efficiency.

Here again, the embossment used in this modified example can be made in substantially the same manner as the process explained with reference to FIGS. 2A through 2D. That is, by coating a resist in form of stripes on the p-type GaN layer 4 as shown in FIG. 2B, and etching it without heating and softening it, the convex portions as shown in FIG. 6 can be made.

Similarly to the device explained with reference to FIG. 1, the modified example shown here also greatly improves the probability of externally leading out light released from the active layer 3, that is, the external quantum efficiency.

Additionally, this modified example is advantageous because it does not require the process of softening the resist pattern as explained with reference to FIG. 2C.

Next explained is a third modified example of the invention.

Figure 7:
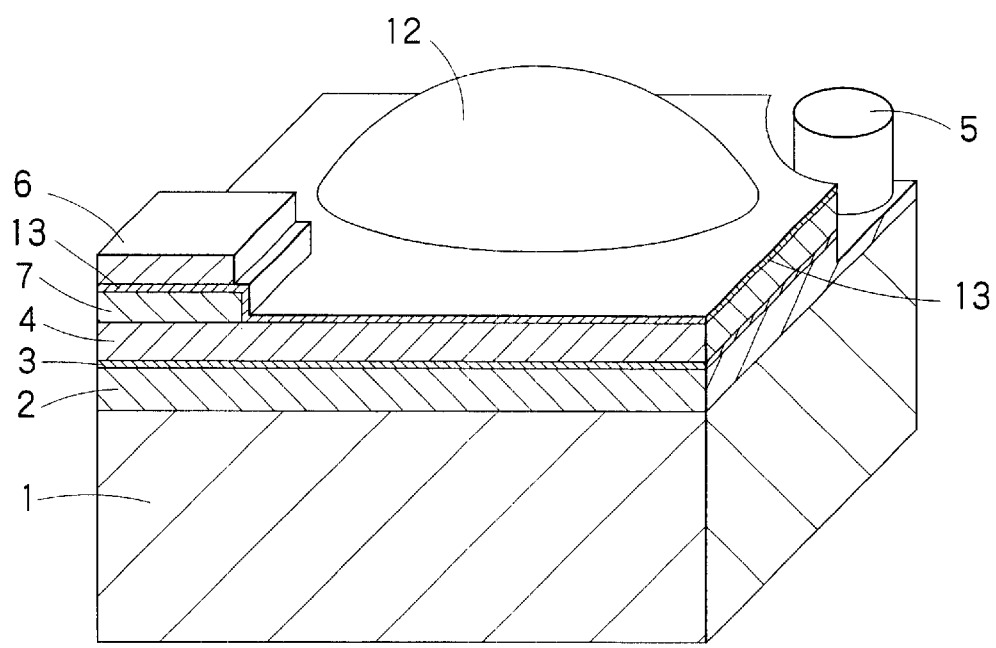
FIG. 7 is a conceptional perspective view illustrating a third modification of the invention.

FIG. 7 is a conceptional perspective view showing the third modified example of the invention. Here again, portions equivalent to those explained with reference to FIGS. 1 through 3D are labeled common reference numerals, and detailed explanation thereof is omitted. In this modified example, a single hemispherical convex portion 12 is formed on the surface of the p-type GaN layer 4. This is also effective for improving the light lead-out efficiency, i.e., the external quantum efficiency.

Here again, the embossment used in this modified example can be made in substantially the same manner as the process explained with reference to FIGS. 2A through 2D. That is, by coating a thick resist having a circular pattern on the p-type GaN layer 4, then heating and softening it to shape it into a single hemisphere and etching it, the convex portion as shown in FIG. 7 can be made.

Similarly to the device explained with reference to FIG. 1, the modified example shown here also greatly improves the probability of externally leading out light released from the active layer 3, that is, the external quantum efficiency.

Additionally, with this modified example, the single lens-shaped convex portion on the surface of the p-type GaN layer 4 ensures a high light converging effect, and improves the coupling efficiency to fibers, for example.

Next explained is a fourth modified example of the invention.

Figure 8:
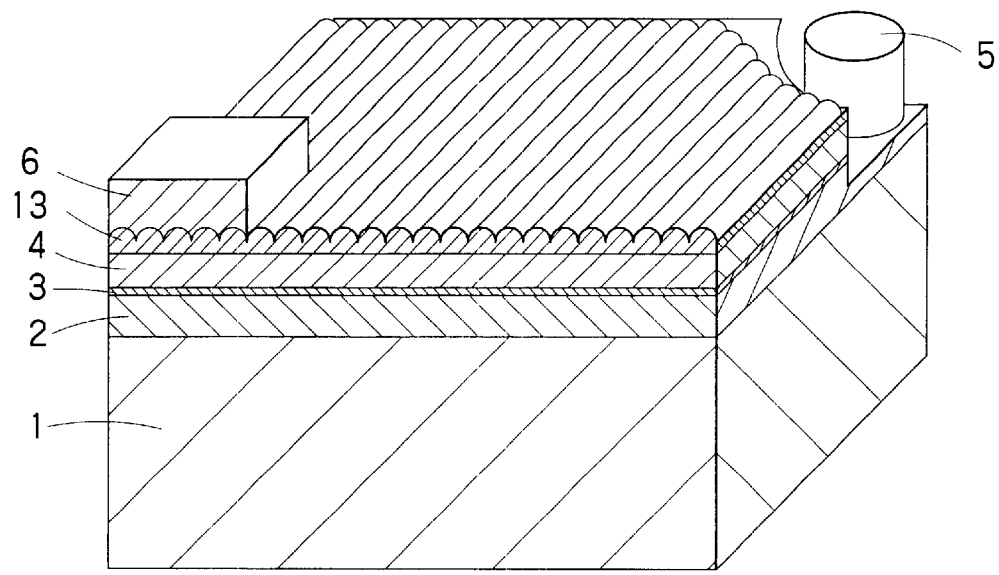
FIG. 8 is a conceptional perspective view illustrating a fourth modification of the invention.

FIG. 8 is a conceptional perspective view showing the fourth modified example of the invention. Here again, portions equivalent to those explained with reference to FIGS. 1 through 3D are labeled common reference numerals, and detailed explanation thereof is omitted. In this modified example, the p-type GaN layer 4 has an even surface, and the p-side transparent electrode 13 stacked thereon is processed to have an embossed surface. This is also effective for improving the light lead-out efficiency, i.e., the external quantum efficiency.

That is, refractive index of ITO frequently used as transparent electrodes 13 is approximately 2.0, and close to 2.67 which is the refractive index of the p-type GaN layer 4. Therefore, almost no total reflection occurs between the p-type GaN layer 4 and the transparent electrode 13, and light can pass through. Then, incident light to the transparent electrode 13 enters there from normal angles smaller than the critical angles at the embossed surface with a high probability similarly to the case explained with reference to FIG. 1. As a result, the light external quantum efficiency can be improved.

Additionally, since this modified example need not process the surface of the p-type GaN layer 4, it is free from damages which might occur during processing of the surface. For example, if the surface of the p-type GaN layer 4 is exposed to excessive plasma or electrically charged particles to process it to make embossment, it may invite deterioration of the surface of the p-type GaN layer 4 or deterioration of the ohmic contact with the p-side electrode. With this modified example, however, since the surface of the p-type GaN layer 4 need not be processed, ohmic contact can be maintained easily.

Further, because of no need for making embossment on the surface of the p-type GaN layer 4, this layer need not be thick.

Pattern of the embossment formed on the surface of the transparent electrode 13 is not limited to the illustrated example, but other patterns such as those shown in FIGS. 1 through 3D are also usable similarly. Size of the pattern is preferably larger than the wavelength of light released from the active layer 3. That is, in the illustrated examples, width and height of each stripe forming the embossment are preferably larger than 500 nm, approximately.

On the other hand, since transparent electrodes of ITO or other like materials are difficult to stack as thick as several microns, it may be necessary to limit width and height of each stripe of the embossment to 1 micron or less. A method for making such minute patterns is "interferometric exposure". This is one of methods used for making gratings of optical semiconductor devices by multiplexing two beams of laser light different in wavelength, dividing them into two fluxes of light through a half mirror, and reflecting individual fluxes of light onto a target by total reflection mirrors located in symmetric positions so as to produce "interference fringes". By exposing a resist through these interference fringes, stripe-shaped minute patterns can be made.

To generate the laser light, a He—Cd laser (wavelength: 325 nm) and an Ar laser (wavelength: 351 nm) can be used, for example.

Another possible method for making the minute patterns is "electron beam exposure". This is a method using a material photo-sensitive to electron beams as a mask, and scanning the mask with the electron beam to make predetermined patterns.

Next explained is a fifth modified example of the invention.

FIG. 9 is a conceptional perspective view showing the fifth modified example of the invention. Here again, portions equivalent to those explained with reference to FIGS. 1 through 3D are labeled common reference numerals, and detailed explanation thereof is omitted. Also in this modified example, the p-type GaN layer 4 has an even surface, and the p-side transparent electrode 13 is deposited thereon. Formed on the p-side transparent electrode 13 is a transparent light lead-out layer 20, and the surface of the light lead-out layer 20 is processed into an embossed plane. This is also effective for improving the light lead-out efficiency, i.e., the external quantum efficiency. Here again, because of no need for making embossment on the surface of the p-type GaN layer 4, this layer need not be thick. In this modified example, conduction is made by connecting the transparent electrode layer 13 and the bonding electrode 6.

Materials of the transparent electrode layer 13 and the light lead-out layer 20 preferably have a transparency to light released from the active layer 3 and a refractive index close to that of the p-type GaN layer 4. That is, if refractive indices of these layers are close to that of the p-type GaN layer 4, total reflection of light between layers can be reduced, and light external quantum efficiency can be increased. Further, if the material of the light lead-out electrode is electrically conductive, it is more advantageous in spreading out the current.

An example of materials usable as the transparent electrode layer 13 is ITO. Usable as the material of the light lead-out layer 20 are, for example, resin or other organic materials and inorganic materials having refractive indices close to those of GaN. When a resin material is used, the layer can be made thick, and large embossment can be made easily, desirably selecting shape and size of the embossment. An exemplary resin material is polycarbonate. Refractive index of polycarbonate is approximately 1.6, which is relatively close to the refractive index of GaN.

Also usable as the material of the light lead-out layer 20 is nitride silicon ($SiN_x$). Since refractive index of silicon nitride is approximately 2.0, close to that of the refractive index of GaN, it can prevent total reflection of light from the active layer 3 between different layers. There are more other materials which will ensure substantially the same results, namely, for example, $In_2O_3$ (refractive index of about 2.0), $Nd_2O_2$ (refractive index of about 2.0), $Sb_2O_3$ (refractive index of about 2.04), $ZrO_2$ (refractive index of about 2.0), $CeO_2$ (refractive index of about 2.2), $TiO_2$ (refractive index of about 2.2 to 2.7), ZnS (refractive index of about 2.35), and $Bi_2O_3$ (refractive index of about 2.45). Further usable as the material of the light lead-out layer 20 are electrically conductive metal oxides.

Additionally, in the example, it is quite easy to incorporate a fluorescent material therein. By incorporating fluorescent material in the light lead-out layer 20, the wavelength of the primary light emitted from the light emitting layer 3 can be converted to a secondary light having a different wavelength. As a result, a mixed output of a primary light from the layer 3 and the secondary lights from the fluorescent material can be provided.

By blending the fluorescent materials, an output light having a desired spectrum can be easily realized. That is, the fluorescent material may include a plurality of different materials to obtain a plurality of different emission wavelengths. For example, by appropriately mixing different fluorescent materials for red (R), green (G) and blue (B) to form the fluorescent material and by incorporating it into the light lead-out layer 20, emission of white light can be obtained easily.

The wavelength of the secondary light released from the fluorescent element can be adjusted by selecting an appropriate material therefor. Exemplary fluorescent materials for absorbing the primary ultraviolet rays from the light emitting layer 3 and for efficiently releasing the secondary light are $Y_2O_2S$:Eu or $La_2O_2S$:(Eu,Sm) for releasing red light; $(Sr, Ca, Ba, Eu)_{10}(PO_4)_6C_{12}$ for releasing blue light; and $3(Ba, Mg, Eu, Mn)O8Al_2O_3$ for releasing green light. By mixing these fluorescent materials by an appropriate ratio, almost all colors in visible bands can be made.

Next explained is a sixth modified example of the invention.

FIG. 10 is a conceptional cross-sectional view showing the sixth modified example of the invention. Here again, portions equivalent to those explained with reference to FIGS. 1 through 9 are labeled common reference numerals, and detailed explanation thereof is omitted. In this modified example, the light emitted from the active layer 3 is released to the outside from the backside of the substrate 1. On the backside of the sapphire substrate 1, the light lead-out layer 22 made of a light transmissive material is formed. A single hemispherical convex portion 23 is formed on the surface of the light lead-out layer 22. Further, anti-reflection (AR) film 24 is coated on the surface of the convex portion 23.

Usable as the material of the light lead-out layer 22 are, for example, semiconductor such as GaN, organic materials such as resin, and inorganic materials. When a resin material is used, the layer can be made thick, and large convex can be made easily, desirably selecting shape and size of the embossment. An exemplary resin material is polycarbonate. Refractive index of polycarbonate is approximately 1.6, which is relatively close to the refractive index of GaN.

Here again, the convex portion 23 can be formed in substantially the same manner as the process explained with reference to FIGS. 2A through 2D. That is, by coating a thick resist having a circular pattern on the light lead-out layer 22, then heating and softening it to shape it into a single hemisphere and etching it, the convex portion as shown in FIG. 10 can be formed.

In the case where the light lead-out layer 22 is made of a resin, the convex portion 23 can be formed by a casting technique or a molding technique.

By forming the p-side electrode 6 with a high-reflective metal such as aluminum, silver, nickel, palladium or platinum, or any combination of these metal layers, the light emitted downward from the active layer 3 can be reflected by the p-side electrode 6 and taken outside through the light lead-out layer 22. As a result, the external quantum efficiency can be further improved. Among the above-specified metals, aluminum or silver is especially advantageous for its high-reflectivity, while nickel, palladium or platinum is especially advantageous for its ohmic characteristics. In case where multiple metal layers are stacked, titanium layer is preferably interposed between the metal layers. For example, a multi-layered structure of silver(~2 nm)/titanium (0.5–1 nm)/aluminum(~300 nm) can be advantageously used where the intervening titanium layer functions so as to improve the adhesion of the multi-layered structure.

Additionally, with this modified example, the single lens-shaped convex portion on the surface of the light lead-out layer 22 ensures a high light converging effect, and improves the coupling efficiency to fibers, for example.

Figure 11:
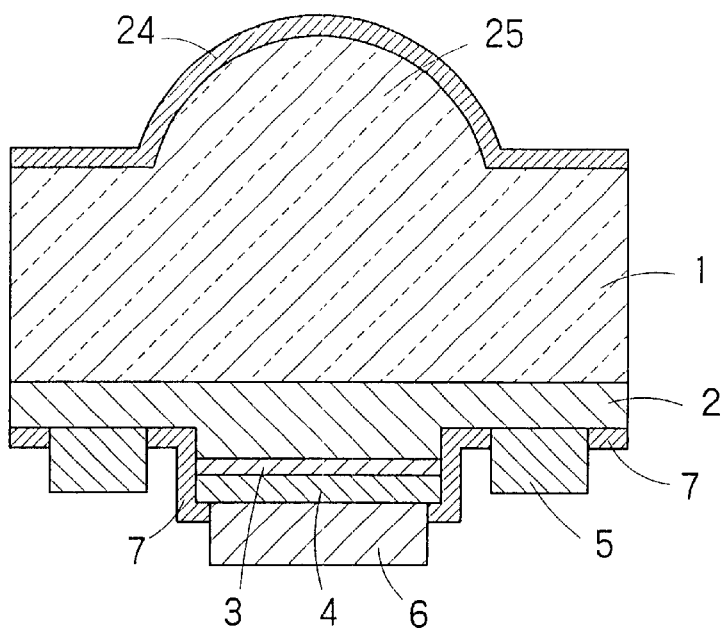
FIG. 11 is a conceptional cross-sectional view illustrating a seventh modification of the invention.

Next explained is a seventh modified example of the invention. FIG. 11 is a conceptional cross-sectional view showing the seventh modified example of the invention. Here again, portions equivalent to those explained with reference to FIGS. 1 through 10 are labeled common reference numerals, and detailed explanation thereof is omitted. In this modified example, the light emitted from the active layer 3 is released to the outside from the backside of the substrate 1.

The backside of the sapphire substrate 1 is patterned and a single hemispherical convex portion 25 is formed. Further, anti-reflection (AR) film 24 is coated on the surface of the convex portion 25.

The p-side electrode 6 is formed with a high-reflective metal such as aluminum, silver, nickel, palladium or platinum, or any combination of these metal layers with a intervening titanium layer, the light emitted downward from the active layer 3 can be reflected by the p-side electrode 6 so as to improve the external quantum efficiency. Among the above-specified metals, aluminum or silver is especially advantageous for its high-reflectivity, while nickel, palladium or platinum is especially advantageous for its ohmic characteristics.

Here again, the convex portion 25 can be formed in substantially the same manner as the process explained with reference to FIGS. 2A through 2D. That is, by forming a mask having a shape of a single hemisphere on the substrate 1, then etching it, the convex portion 25 as shown in FIG. 11 can be formed. Since it is not easy to etch sapphire chemically, a physical etching technique such as ion milling may preferably used for the etching process.

Next explained is a eighth modified example of the invention.

Figure 12:
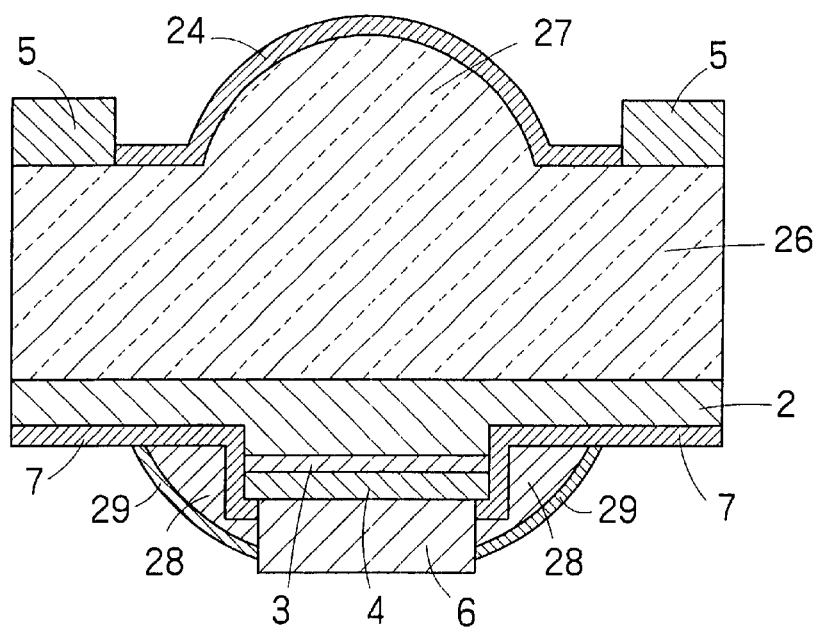
FIG. 12 is a conceptional cross-sectional view illustrating a eighth modification of the invention.

FIG. 12 is a conceptional cross-sectional view showing the eighth modified example of the invention. Here again, portions equivalent to those explained with reference to FIGS. 1 through 11 are labeled common reference numerals, and detailed explanation thereof is omitted. In this modified example, a substrate 26 made of n-type GaN instead of sapphire is used and a single hemispherical convex portion 27 is formed on the backside of the substrate 26. Further, anti-reflection (AR) film 24 is coated on the surface of the convex portion 27. The n-side electrodes 5 are formed on the backside of the substrate 26.

The p-side electrode 6 is formed with a reflective metal such as aluminum, silver, nickel, palladium or platinum, or any combination of these metal layers with a intervening titanium layer, the light emitted downward from the active layer 3 can be reflected by the p-side electrode 6 so as to improve the external quantum efficiency.

Further, a light-transmissive portion 28 made of a light-transmissive material is formed on the side surface of the mesa which includes the active layer 3, and a reflective layer 29 is coated on the surface of the light-transmissive portion 28. The reflective layer 29 can be formed with a reflective metal or a Bragg's mirror comprising a multi-layered dielectric films. The reflective layer 29 reflects the light leaking sideward from the active layer 3 of the mesa so as to release the light outside through the convex portion 27. As a result, the external quantum efficiency can be further improved.

The GaN substrate 26 can be formed by epitaxially growing a thick GaN layer on a sapphire substrate (not shown) then by removing the sapphire substrate.

In the example shown in the figure, the n-side electrodes 5 are formed on the backside of the substrate 26, however, the electrodes 5 can be formed on the same side as the p-side electrode 6 as exemplarily shown in FIGS. 10 and 11.

Also in the example shown in the figure, the substrate 26 and the layers 2–4 are made of nitride compound semiconductors, however, these elements can be formed of other appropriate materials such as GaAs/AlGaAs-alloys, InGaAlP-alloys and InP/InGaAs-alloys. For example, the substrate 26 can be formed of GaP, the layers 2–4 can be formed of InGaAlP-alloys or GaAs/AlGaAs-alloys, respectively. In this case, the layers 2–4 can be grown on a GaAs substrate in advance, then the layers 2–4 are removed from the GaAs substrate by an etching technique and bonded to the GaP substrate 26. Since GaP is transparent to the light emitted from the InGaAlP or GaAs light emitting layer 3, the external quantum efficiency can be greatly improved by employing the GaP substrate 26. At the same time, according to the invention, the external quantum efficiency can be further improved by providing the light-transmissive portion 28 on the side surface of the mesa which includes the active layer 3, and by coating the reflective layer 29 thereon.

Next explained is a ninth modified example of the invention.

FIG. 13 is a conceptional cross-sectional view showing the ninth modified example of the invention. Here again, portions equivalent to those explained with reference to FIGS. 1 through 12 are labeled common reference numerals, and detailed explanation thereof is omitted. In this modified example, a substrate 26 made of n-type GaN instead of sapphire is used. The backside surface of the substrate 26 is made flat and the anti-reflection (AR) film 24 is coated on the surface. The n-side electrodes 5 are formed on the backside of the substrate 26.

Embossment is formed on the surface of the p-type GaN layer 4 on which the p-side electrode 6 is formed with a reflective metal such as aluminum, silver, nickel, palladium or platinum, or any combination of these metal layers with a intervening titanium layer, so as to reflect the light emitted downward from the active layer 3. That is, in the example, the embossment is formed not on the light lead-out surface but on the light-reflecting interface in a rather random fashion. By forming such embossment on the light-reflecting interface, the light emitted from the active layer 3 is uniformly reflected by an irregular reflection and taken outside through the AR film 24 with a uniform intensity distribution.

Instead of the embossment shown in FIG. 13, various kinds of embossment or convex portions such as exemplarily shown in FIGS. 1 through 12 can be formed on the light-reflecting interface as well.

The invention has been explained above by way of embodiments of the invention with reference to specific examples. The invention, however, is not limited to these specific example. For example, embossment formed on the surface of the GaN layer may be any of other various configurations, and any regular or random patterns ensure the same effects.

Additionally, those skilled in the art will be able to adequately change the structure of the light emitting device in practical use thereof. That is, if necessary, multi-layered structure, materials and compositions of the device may be optimized. For example, the active layer may be made in form of a multi-quantum well structure, or cladding layers may be added on and under the active layer.

Further, the material of the substrate is not limited to sapphire, other substrates such as insulating substrates of spinel, MgO, SeAlMgO$_4$, LaSrGaO$_4$ and (LaSr)(AlTa)O$_3$, conducting substrates of SiC, Si, GaAs and GaN are also usable to obtain respective effects. In case of a ScAlMgO$_4$ substrate, its (0001)-oriented surface is preferably used. In case of a (LaSr)(AlTa)O$_3$ substrate is used, its (111)-oriented surface is preferably used. Especially in case of GaN, a GaN layer, which is grown sufficiently thick on a sapphire substrate by hydride vapor phase deposition, for example, and thereafter separated from the sapphire substrate, can be used as a GaN substrate.

When a conductive substrate of GaN, etc. is used, the n-side electrode of the light emitting device can be formed on the bottom surface of the substrate.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor light emitting device comprising:
   a light emitting portion made of a nitride compound semiconductor;
   a light lead-out surface on which an embossment is formed to improve the external quantum efficiency of light emitted from said light emitting portion;
   a nitride compound semiconductor layer; and
   a transparent electrode;
   said embossment being formed on one surface of said nitride compound semiconductor layer, and said transparent electrode being formed on said one surface of said nitride compound semiconductor layer.

2. The semiconductor light emitting device according to claim 1 wherein said nitride compound semiconductor layer under said transparent electrode contains a p-type dopant with a high concentration near the interface to said transparent electrode layer.

3. The semiconductor light emitting device according to claim 1 wherein said transparent electrode includes a layer of a metal having a thickness not thicker than 100 nm and formed in contact with said nitride compound semiconductor.

4. The semiconductor light emitting device according to claim 3 wherein said metal contains at least one of nickel (Ni) and platinum (Pt).

5. A semiconductor light emitting device comprising:
   a light emitting portion made of a nitride compound semiconductor;
   a light lead-out surface on which an embossment is formed to improve the external quantum efficiency of light emitted from said light emitting portion;
   a nitride compound semiconductor layer; and
   a transparent electrode;
   said embossment being formed on one surface of said nitride compound semiconductor layer, and said transparent electrode being formed on said one surface of said nitride compound semiconductor layer;
   wherein said embossment includes a plurality of cylindrical lens-shaped convex portions.

6. A semiconductor light emitting device comprising:

a light emitting portion made of a nitride compound semiconductor;

a light lead-out surface on which an embossment is formed to improve the external quantum efficiency of light emitted from said light emitting portion;

a nitride compound semiconductor layer; and a transparent electrode;

said embossment being formed on one surface of said nitride compound semiconductor layer, and said transparent electrode being formed on said one surface of said nitride compound semiconductor layer;

wherein said embossment includes a hemispherical convex portion.

7. A semiconductor light emitting device comprising:

a light emitting portion made of a nitride compound semiconductor;

a light lead-out surface on which an embossment is formed to improve the external quantum efficiency of light emitted from said light emitting portion;

a nitride compound semiconductor layer;

a transparent electrode;

a nitride compound semiconductor layer having an even surface; and a transparent electrode formed on said nitride compound semiconductor layer;

said embossment being formed on one surface of said nitride compound semiconductor layer, and said transparent electrode being formed on said one surface of said nitride compound s conductor layer and said embossment being formed on a surface of said transparent electrode.

8. A semiconductor light emitting device comprising:

a light emitting portion made of a nitride compound semiconductor;

a light readout surface on which an embossment is formed to improve the external quantum efficiency of light emitted from said light emitting portion;

a nitride compound semiconductor layer having an even surface;

a transparent electrode formed on said even surface of said nitride compound semiconductor layer; and a light lead-out layer formed on said transparent electrode and having a transparency;

said embossment being formed on a surface of said light lead-out layer.

9. The semiconductor light emitting device according to claim 8 wherein said light lead-out layer is made of an organic material or an inorganic material.

10. The semiconductor light emitting device according to claim 8 wherein said light lead-out layer includes a fluorescent material which absorbs a primary light emitted from said light emitting portion and releases a secondary light having a different wavelength from said primary light.

11. A semiconductor light emitting device comprising:

a light emitting portion made of a nitride compound semiconductor;

a light lead-out surface on which an embossment is formed to improve the external quantum efficiency of light emitted from said light emitting portion;

a substrate made of a material other than nitride compound semiconductor; and a reflector reflecting a light emitted from said light emitting portion to release said light outside through said substrate;

wherein said reflector also serves as an electrode injecting a current into said light emitting portion; and said light emitting portion being provided on one side of said substrate, and said embossment being provided on another side of said substrate.

12. A semiconductor light emitting device comprising:

a light emitting portion made of a nitride compound semiconductor;

a light lead-out surface on which an embossment is formed to improve the external quantum efficiency of light emitted from said light emitting portion;

a substrate made of nitride compound semiconductor; and a reflector reflecting a light emitted from said light emitting portion to release said light outside through said substrate;

wherein said reflector also serves as an electrode injecting a current into said light emitting portion; and said light emitting portion being provided on one side of said substrate, and said embossment being provided on another side of said substrate.

13. A semiconductor light emitting device comprising:

a substrate;

a mesa provided on one side of said substrate and including a light emitting portion;

a reflector provided on said mesa and reflecting a light emitted from said light emitting portion to release said light outside through said substrate;

a light-transmissive portion provided on a side surface of said mesa;

a reflective layer coated on a surface of said light-transmissive portion; and an embossment provided on another side of said substrate to improve the external quantum efficiency of lights emitted from said light emitting portion, said reflective layer reflecting a light leaking sideward from said light emitting portion of said mesa so as to release the light outside through said substrate.

* * * * *